United States Patent
Po

(10) Patent No.: US 12,014,783 B2
(45) Date of Patent: Jun. 18, 2024

(54) DRIVING CIRCUIT FOR NON-VOLATILE MEMORY

(71) Applicant: eMemory Technology Inc., Hsin-Chu (TW)

(72) Inventor: Chen-Hao Po, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 198 days.

(21) Appl. No.: 17/878,948

(22) Filed: Aug. 2, 2022

(65) Prior Publication Data

US 2023/0223092 A1 Jul. 13, 2023

Related U.S. Application Data

(60) Provisional application No. 63/298,202, filed on Jan. 10, 2022.

(51) Int. Cl.
*G11C 16/30* (2006.01)
(52) U.S. Cl.
CPC ..................................... *G11C 16/30* (2013.01)
(58) Field of Classification Search
CPC ................................ G11C 16/30; G11C 5/147
See application file for complete search history.

(56) References Cited

U.S. PATENT DOCUMENTS

| | | | |
|---|---|---|---|
| 7,145,370 B2 | 12/2006 | Bernard et al. | |
| 7,580,311 B2 | 8/2009 | Pesavento | |
| 8,373,485 B2 | 2/2013 | Po et al. | |
| 8,823,443 B2* | 9/2014 | Curatola | H02M 3/07 327/536 |
| 9,252,775 B2 | 2/2016 | Schrom et al. | |
| 9,882,566 B1* | 1/2018 | Po | G11C 7/1084 |
| 2011/0032776 A1* | 2/2011 | Watanabe | G11C 5/143 365/189.09 |
| 2022/0180943 A1* | 6/2022 | Cernea | G11C 16/08 |

FOREIGN PATENT DOCUMENTS

| | | | |
|---|---|---|---|
| TW | 201318339 A | 5/2013 | |
| TW | 201801084 A | 1/2018 | |

OTHER PUBLICATIONS

Office Action issued by Taiwan Intellectual Property Office on Jan. 15, 2024.

* cited by examiner

*Primary Examiner* — Joshua L Schwartz
(74) *Attorney, Agent, or Firm* — WPAT, P.C

(57) ABSTRACT

A driving circuit includes a cross coupled circuit, a first conducting device, a second conducting device, a first switching device, a second switching device, a first selecting device and a second selecting device. The first conducting device is connected between a first node and a second node. The second conducting device is connected between a third node and a fourth node. The cross coupled circuit receives a first supply voltage and is connected with the first node and the second node. The first switching device is connected between the second node and a fifth node. The second switching device is connected between the fourth node and a sixth node. The first and second selecting devices are respectively connected with the fifth node and the sixth node. Each of the first and second selecting devices receives a second supply voltage and a third supply voltage.

14 Claims, 9 Drawing Sheets

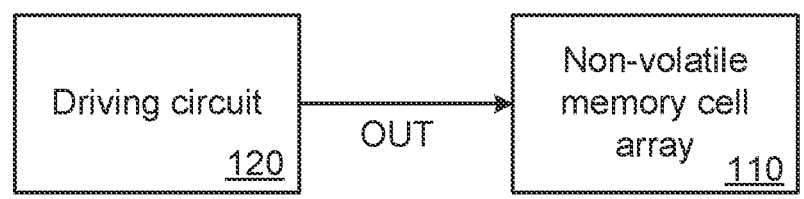
FIG. 1 (PRIOR AR)
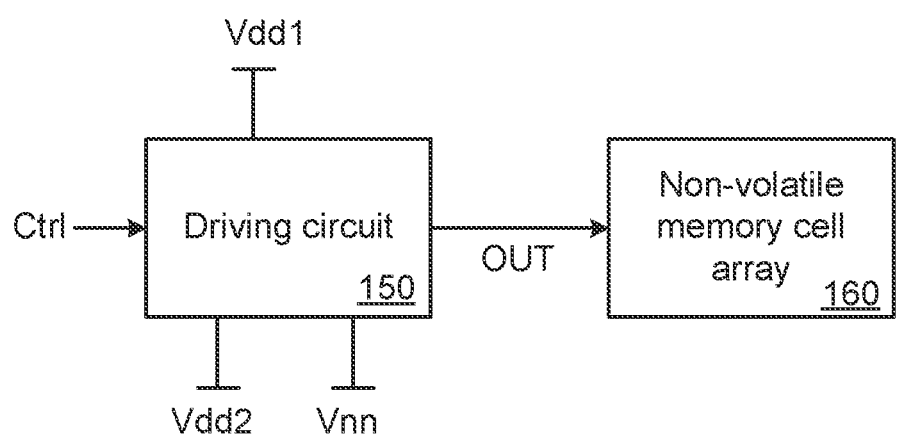
FIG. 2

| | Ctrl1 | Ctrl2 | Ctrl3 | Ctrl4 | OUT |
|---|---|---|---|---|---|
| Mode1 | close | open | Vdd2 | Vdd2 | Vdd1 |
| Mode2 | open | close | Vdd2 | Vdd2 | Vdd2 |
| Mode3 | open | close | Vdd2 | Vnn | Vnn |

| | Ctrl1 | Ctrl2 | Ctrl3 | Ctrl4 | OUT |
|---|---|---|---|---|---|
| Mode1 | Von | Voff | Vin1 | Vin1 | Vdd1 |
| Mode2 | Voff | Von | Vin1 | Vin1 | Vdd2 |
| Mode3 | Voff | Von | Vin1 | Vin2 | Vnn |

DRIVING CIRCUIT FOR NON-VOLATILE MEMORY

This application claims the benefit of U.S. provisional application Ser. No. 63/298,202, filed Jan. 10, 2022, the subject matters of which is incorporated herein by reference.

FIELD OF THE INVENTION

The present invention relates to a driving circuit, and more particularly to a driving circuit for a non-volatile memory.

BACKGROUND OF THE INVENTION

Non-volatile memories have been widely used in a variety of electronic products. After the supplied power is interrupted, the data stored in the non-volatile memory is still retained. The non-volatile memory comprises a non-volatile memory cell array with plural non-volatile memory cells. Each non-volatile memory cell comprises a floating gate transistor.

FIG. 1 is a schematic circuit block diagram illustrating the architecture of a conventional non-volatile memory. The non-volatile memory comprises a non-volatile memory cell array 110 and a driving circuit 120. The driving circuit 120 is connected with the non-volatile memory cell array 110. In various operation modes, the driving circuit 120 provides different driving signals to the non-volatile memory cell array 110.

For example, according to the operation modes of the non-volatile memory cell array 110, the driving circuit 120 provides different driving signals OUT to control a read operation, an erase operation or a program operation of the non-volatile memory cell array 110.

For example, a driving circuit for a non-volatile memory is disclosed in U.S. Pat. No. 9,882,566 B1. When the input signal inputted into the driving circuit is changed, the driving circuit generates a driving signal with a different voltage to the non-volatile memory cell array.

SUMMARY OF THE INVENTION

An embodiment of the present invention provides a driving circuit. The driving circuit is connected with a non-volatile memory cell array. The driving circuit includes a first conducting device, a second conducting device, a first transistor, a second transistor, a first switching device, a second switching device, a first selecting device and a second selecting device. A first terminal of the first conducting device is connected with a first node. A second terminal of the first conducting device is connected with a second node. A first terminal of the second conducting device is connected with a third node. A second terminal of the second conducting device is connected with a fourth node. A voltage at the fourth node is served as a driving signal. The driving signal is transmitted to the non-volatile memory cell array. A first drain/source terminal of the first transistor receives a first supply voltage. A second drain/source terminal of the first transistor is connected with the first node. A gate terminal of the first transistor is connected with the third node. A first drain/source terminal of the second transistor receives the first supply voltage. A second drain/source terminal of the second transistor is connected with the third node. A gate terminal of the second transistor is connected with the first node. A first terminal of the first switching device is connected with the second node, a second terminal of the first switching device is connected with a fifth node. A control terminal of the first switching device receives a first control signal. A first terminal of the second switching device is connected with the fourth node. A second terminal of the second switching device is connected with a sixth node. A control terminal of the second switching device receives a second control signal. A first terminal of the first selecting device is connected with the fifth node. A second terminal of the first selecting device receives a second supply voltage. A third terminal of the first selecting device receives a third supply voltage. A control terminal of the first selecting device receives a third control signal. A first terminal of the second selecting device is connected with the sixth node. A second terminal of the second selecting device receives the second supply voltage. A third terminal of the second selecting device receives the third supply voltage. A control terminal of the second selecting device receives a fourth control signal. The first switching device is in an open state or a close state according to the first control signal. The second switching device is in the open state or the close state according to the second control signal. Moreover, one of the second supply voltage and the third supply voltage is transmitted to the fifth node through the first selecting device according to the third control signal, and one of the second supply voltage and the third supply voltage is transmitted to the sixth node through the second selecting device according to the fourth control signal.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 1 (prior art) is a schematic circuit block diagram illustrating the architecture of a conventional non-volatile memory;

FIG. 2 is a schematic circuit block diagram illustrating the architecture of a non-volatile memory according to an embodiment of the present invention;

DETAILED DESCRIPTION OF PREFERRED EMBODIMENTS

The present invention provides a driving circuit for a non-volatile memory. The driving circuit is connected to the non-volatile memory. The driving circuit can be properly controlled to generate driving signals with different driving voltages to the non-volatile memory.

FIG. 2 is a schematic circuit block diagram illustrating the architecture of a non-volatile memory according to an embodiment of the present invention. The non-volatile memory comprises a non-volatile memory cell array 160 and a driving circuit 150. The driving circuit 150 is connected with the non-volatile memory cell array 160.

The driving circuit 150 receives supply voltages Vdd1, Vdd2 and Vnn. Moreover, the driving circuit 150 receives a control signal Ctrl. In various operation modes, the driving circuit 150 is controlled according to the control signal Ctrl. Consequently, the driving circuit 150 selects one of the three supply voltages Vdd1, Vdd2 and Vnn as a driving signal OUT. In addition, the driving signal OUT is transmitted to the non-volatile memory cell array 160. The detailed circuitry structure of the driving circuit 150 will be described as follows.

Figures 3A, 3B:
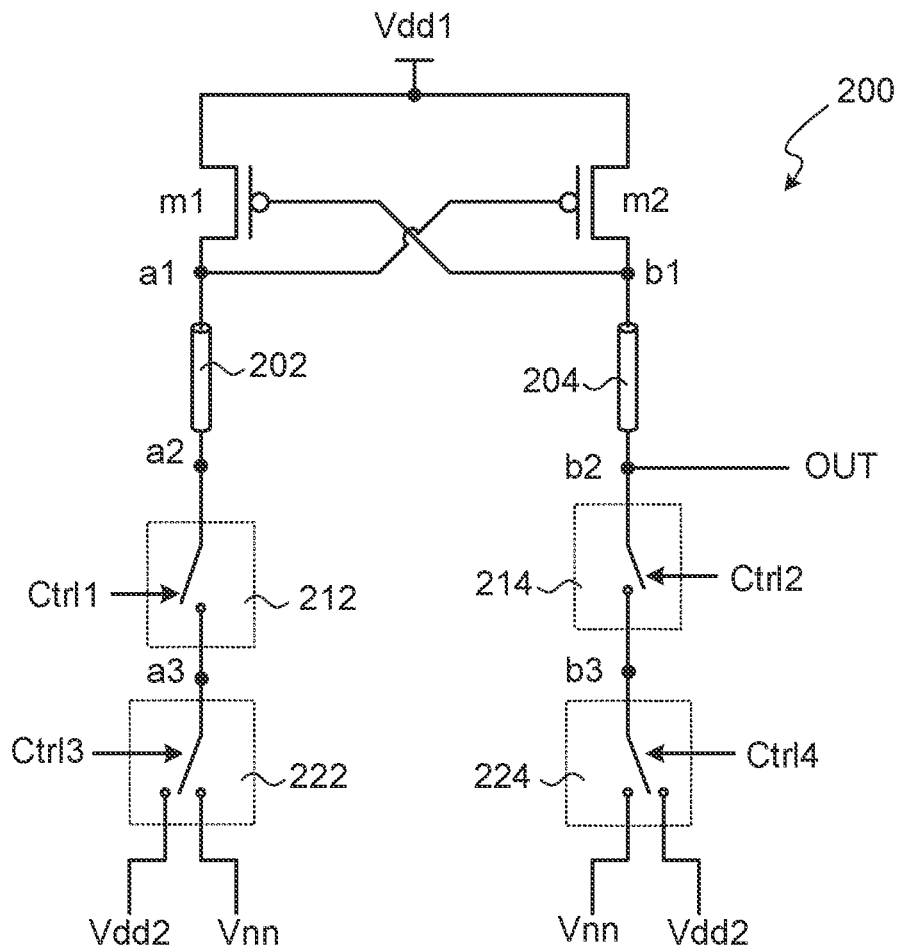
FIG. 3A is a schematic circuit diagram illustrating the circuitry structure of a driving circuit for the non-volatile memory according to a first embodiment of the present invention.
FIG. 3B is an operation table of the driving circuit as shown in FIG. 3A.

FIG. 3A is a schematic circuit diagram illustrating the circuitry structure of a driving circuit for the non-volatile memory according to a first embodiment of the present invention. FIG. 3B is an operation table of the driving circuit as shown in FIG. 3A. The driving circuit 200 provides a driving signal OUT to the non-volatile memory cell array.

The driving circuit 200 comprises a transistor m1, transistor m2, two conducting devices 202, 204, two switching devices 212, 214 and two selecting devices 222, 224. The transistor m1 and the transistor m2 are p-type transistors.

The transistor m1 and the transistor m2 are collaboratively formed as a cross coupled circuit. The first drain/source terminal of the transistor m1 receives the supply voltage Vdd1. The gate terminal of the transistor m1 is connected with a node b1. The second drain/source terminal of the transistor m1 is connected with a node a1. The first drain/source terminal of the transistor m2 receives the supply voltage Vdd1. The gate terminal of the transistor m2 is connected with the node a1. The second drain/source terminal of the transistor m2 is connected with the node b1.

The conducting device 202 is connected between the node a1 and the node a2. The conducting device 204 is connected between the node b1 and the node b2. Generally, the region between the node a1 and the node a2 is maintained in a conducting state through the conducting device 202. Similarly, the region between the node b1 and the node b2 is maintained in a conducting state through the conducting device 204. Moreover, the voltage at the node b2 is used as the driving signal OUT.

The first terminal of the switching device 212 is connected with the node a2. The second terminal of the switching device 212 is connected with a node a3. The control terminal of the switching device 212 receives a control signal Ctrl1. According to the control signal Ctrl1, the switching device 212 is selectively in an open state or a close state. The first terminal of the switching device 214 is connected with the node b2. The second terminal of the switching device 214 is connected with a node b3. The control terminal of the switching device 214 receives a control signal Ctrl2. According to the control signal Ctrl2, the switching device 214 is selectively in an open state or a close state.

The first terminal of the selecting device 222 is connected with the node a3. The second terminal of the selecting device 222 is connected with the supply voltage Vdd2. The third terminal of the selecting device 222 receives the supply voltage Vnn. The control terminal of the selecting device 222 receives a control signal Ctrl3. According to the control signal Ctrl3, the supply voltage Vdd2 or the third supply voltage Vnn is transmitted to the node a3 through the selecting device 222. The first terminal of the selecting device 224 is connected with the node b3. The second terminal of the selecting device 224 receives the supply voltage Vdd2. The third terminal of the selecting device 224 receives the supply voltage Vnn. The control terminal of the selecting device 224 receives a control signal Ctrl4. According to the control signal Ctrl4, the supply voltage Vdd2 or the third supply voltage Vnn is transmitted to the node b3 though the selecting device 224.

In this embodiment, the magnitude of the supply voltage Vdd1 is higher than the magnitude of the supply voltage Vdd2, and the magnitude of the supply voltage Vdd2 is higher than the magnitude of the supply voltage Vnn. For example, the supply voltage Vdd1 is 18V, the supply voltage Vdd2 is 6V, and the supply voltage Vnn is 0V.

In various operation modes, the driving circuit 200 is controlled according to the control signals Ctrl1-Ctrl4. Consequently, one of the three supply voltages Vdd1, Vdd2 and Vnn is transmitted from the driving circuit 200 to the node b2 and served as the driving signal OUT.

Please refer to FIG. 3B. In the operation mode Mode1, the switching device 212 is controlled to the close state according to the control signal Ctrl1. The switching device 214 is controlled to the open state according to the control signal Ctrl2. The supply voltage Vdd2 is selected by the selecting device 222 according to the control signal Ctrl3. In addition, the supply voltage Vdd2 is transmitted to the node a3. The supply voltage Vdd2 is selected by the selecting device 224 according to the control signal Ctrl4. In addition, the supply voltage Vdd2 is transmitted to the node b3.

Since the switching device 212 is in the close state and the switching device 214 is in the open state, the supply voltage Vdd2 is transmitted from the node a3 to the node a2 through the switching device 212. Moreover, the supply voltage Vdd2 is transmitted from the node a2 to the node a1 through the conducting device 202. Consequently, the transistor m2 is turned on. Under this circumstance, the voltage at the node b1 is the supply voltage Vdd1, and the transistor m1 is turned off. In addition, the supply voltage Vdd1 is transmitted to the node b2 through the conducting device 204 and served as the driving signal OUT. That is, in the operation mode Mode1, the driving signal OUT is the supply voltage Vdd1.

In the operation mode Mode2, the switching device 212 is controlled to the open state according to the control signal Ctrl1. The switching device 214 is controlled to the close state according to the control signal Ctrl2. The supply voltage Vdd2 is selected by the selecting device 222 according to the control signal Ctrl3. In addition, the supply voltage Vdd2 is transmitted to the node a3. The supply voltage Vdd2 is selected by the selecting device 224 according to the control signal Ctrl4. In addition, the supply voltage Vdd2 is transmitted to the node b3.

Since the switching device 212 is in the open state and the switching device 214 is in the close state, the supply voltage Vdd2 is transmitted from the node b3 to the node b2 through the switching device 214 and served as the driving signal OUT. Moreover, the supply voltage Vdd2 is transmitted from the node b2 to the node b1 through the conducting device 204. Consequently, the transistor m1 is turned on. Since the voltage at the node a1 is equal to the supply voltage Vdd1, the transistor m2 is turned off. That is, in the operation mode Mode2, the driving signal OUT is the supply voltage Vdd2.

In the operation mode Mode3, the switching device 212 is controlled to the open state according to the control signal Ctrl1. The switching device 214 is controlled to the close state according to the control signal Ctrl2. The supply voltage Vdd2 is selected by the selecting device 222 according to the control signal Ctrl3. In addition, the supply voltage Vdd2 is transmitted to the node a3. The supply voltage Vnn is selected by the selecting device 224 according to the control signal Ctrl4. In addition, the supply voltage Vnn is transmits to the node b3.

Since the switching device 212 is in the open state and the switching device 214 is in the close state, the supply voltage Vnn is transmitted from the node b3 to the node b2 through the switching device 214 and served as the driving signal OUT. Moreover, the supply voltage Vnn is transmitted from the node b2 to the node b1 through the conducting device 204. Consequently, the transistor m1 is turned on. Since the voltage at the node a1 is equal to the supply voltage Vdd1, the transistor m2 is turned off. That is, in the operation mode Mode3, the driving signal OUT is the supply voltage Vnn.

Figure 4:
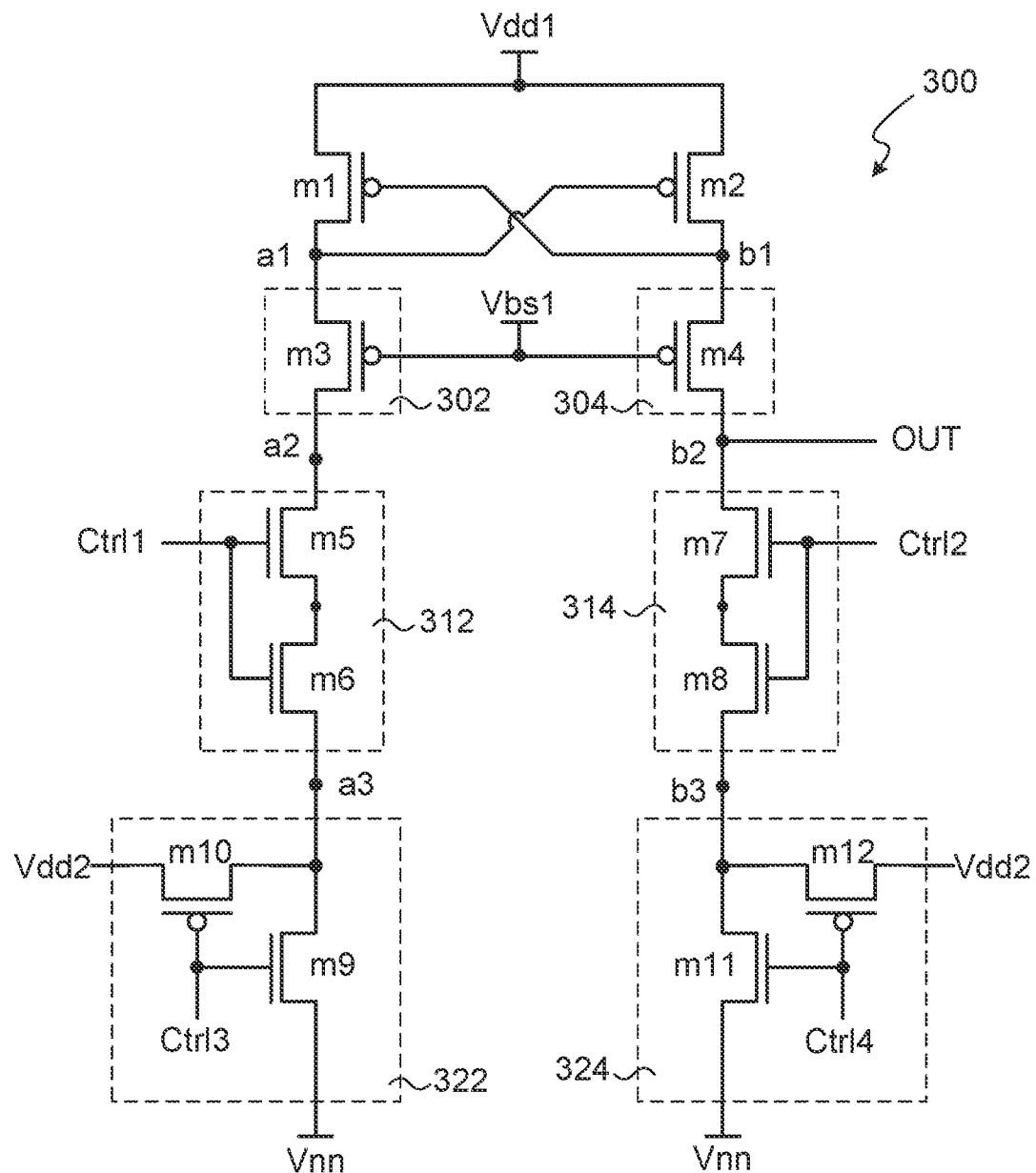
FIG. 4 is a schematic circuit diagram illustrating a driving circuit for the non-volatile memory according to a second embodiment of the present invention.

FIG. 4 is a schematic circuit diagram illustrating a driving circuit for the non-volatile memory according to a second embodiment of the present invention. The driving circuit 300 provides a driving signal OUT to the non-volatile memory cell array. The magnitude of the supply voltage Vdd1 is higher than the magnitude of the supply voltage Vdd2, and the magnitude of the supply voltage Vdd2 is higher than the magnitude of the supply voltage Vnn. For example, the supply voltage Vdd1 is 18V, the supply voltage Vdd2 is 6V, and the supply voltage Vnn is 0V.

The driving circuit 300 comprises a transistor m1, transistor m2, two conducting devices 302, 304, two switching devices 312, 314 and two selecting devices 322, 324. The transistor m1 and the transistor m2 are p-type transistors.

The transistor m1 and the transistor m2 are collaboratively formed as a cross coupled circuit. The first drain/source terminal of the transistor m1 receives the supply voltage Vdd1. The gate terminal of the transistor m1 is connected with a node b1. The second drain/source terminal of the transistor m1 is connected with a node a1. The first drain/source terminal of the transistor m2 receives the supply voltage Vdd1. The gate terminal of the transistor m2 is connected with the node a1. The second drain/source terminal of the transistor m2 is connected with the node b1.

The conducting device 302 comprises a transistor m3. The first drain/source terminal of the transistor m3 is connected with the node a1. The second drain/source terminal of the transistor m3 is connected with the node a2. The gate terminal of the transistor m3 receives a bias voltage Vbs1. The conducting device 304 comprises a transistor m4. The first drain/source terminal of the transistor m4 is connected with the node b1. The second drain/source terminal of the transistor m4 is connected with the node b2. The gate terminal of the transistor m4 receives the bias voltage Vbs1. The transistor m3 and the transistor m4 are p-type transistors.

Moreover, according to the bias voltage Vbs1, the transistor m3 and the transistor m4 are turned on. For example, the bias voltage Vbs1 is 3V. Consequently, the region between the node a1 and the node a2 is maintained in a conducting state through the conducting device 302, and the region between the node b1 and the node b2 is maintained in a conducting state through the conducting device 304. Moreover, the voltage at the node b2 is the driving signal OUT.

The switching device 312 comprises a transistor m5 and a transistor m6. The first drain/source terminal of the transistor m5 is connected with the node a2. The gate terminal of the transistor m5 receives a control signal Ctrl1. The first drain/source terminal of the transistor m6 is connected with the second drain/source terminal of the transistor m5. The gate terminal of the transistor m6 receives the control signal Ctrl1. The second drain/source terminal of the transistor m6 is connected with a node a3. The transistor m5 and the transistor m6 are n-type transistors.

The switching device 314 comprises a transistor m7 and a transistor m8. The first drain/source terminal of the transistor m7 is connected with the node b2. The gate terminal of the transistor m7 receives a control signal Ctrl2. The first drain/source terminal of the transistor m8 is connected with the second drain/source terminal of the transistor m7. The gate terminal of the transistor m8 receives the control signal Ctrl2. The second drain/source terminal of the transistor m8 is connected with a node b3. The transistor m7 and the transistor m8 are n-type transistors.

Generally, both of the transistor m5 and the transistor m6 are simultaneously turned on or turned off according to the control signal Ctrl1. For example, in case that the control signal Ctrl1 is an on voltage Von, the transistor m5 and the transistor m6 are simultaneously turned on. Consequently, the switching device 312 is in the close state. Whereas, in case that the control signal Ctrl1 is an off voltage Voff, the transistor m5 and the transistor m6 are simultaneously turned off. Consequently, the switching device 312 is in the open state. Moreover, the magnitude of the on voltage Von is higher than the magnitude of the off voltage Voff.

Similarly, both of the transistor m7 and the transistor m8 are simultaneously turned on or turned off according to the control signal Ctrl2. For example, in case that the control signal Ctrl2 is the on voltage Von, the transistor m7 and the transistor m8 are simultaneously turned on. Consequently, the switching device 314 is in the close state. Whereas, in case that the control signal Ctrl1 is the off voltage Voff, the transistor m7 and the transistor m8 are simultaneously turned off. Consequently, the switching device 314 is in the open state. For example, the on voltage Von is 8V, and the off voltage Voff is 6V.

In the second embodiment, the switching device 312 is composed of two transistors m5 and m6, and the switching device 314 is composed of two transistors m7 and m8. However, the present invention is not limited to this. In order to match the various supply voltages Vdd1, Vdd2 and Vnn, and to comply with the safe operation area (SOA) criteria, the switching device 312 and 314 may be composed of other numbers of transistors. For example, the switching device 312 comprises three transistors serially connected between the node a2 and the node a3, and the gates of the three transistors receive the control signal Ctrl1.

The selecting device 322 comprises a transistor m9 and a transistor m10. The first drain/source terminal of the transistor m9 is connected with the node a3. The gate terminal of the transistor m9 receives a control signal Ctrl3. The second drain/source terminal of the transistor m9 receives the supply voltage Vnn. The first drain/source terminal of the transistor m10 is connected with the node a3. The gate terminal of the transistor m10 receives the control signal Ctrl3. The second drain/source terminal of the transistor m10 receives the supply voltage Vdd2. Moreover, the transistor m9 is an n-type transistor, and the transistor m10 is a p-type transistor.

The selecting device 324 comprises a transistor m11 and a transistor m12. The first drain/source terminal of the transistor m11 is connected with the node b3. The gate terminal of the transistor m11 receives a control signal Ctrl4. The second drain/source terminal of the transistor m11 receives the supply voltage Vnn. The first drain/source terminal of the transistor m12 is connected with the node b3. The gate terminal of the transistor m12 receives the control signal Ctrl4. The second drain/source terminal of the transistor m12 receives the supply voltage Vdd2. Moreover, the transistor m11 is an n-type transistor, and the transistor m12 is a p-type transistor.

The transistor m9 and the transistor m10 are controlled according to the control signal Ctrl3. In case that the control signal Ctrl3 is an input voltage Vin1, the transistor m9 is turned off, and the transistor m10 is turned on. Consequently, the supply voltage Vdd2 is selected by the selecting device 322. In addition, the supply voltage Vdd2 is transmitted to the node a3. Whereas, in case that the control signal Ctrl3 is an input voltage Vin2, the transistor m9 is turned on, and the transistor m10 is turned off. Consequently, the supply voltage Vnn is selected by the selecting device 322. The supply voltage Vnn is transmitted to the node a3. Moreover, the magnitude of the input voltage Vin2 is higher than the magnitude of the input voltage Vin1.

Similarly, both of the transistor m11 and the transistor m12 are controlled according to the control signal Ctrl4. In case that the control signal Ctrl4 is the input voltage Vin1, the transistor m11 is turned off, and the transistor m12 is turned on. Consequently, the supply voltage Vdd2 is selected by the selecting device 324. The supply voltage Vdd2 is transmitted to the node b3. Whereas, in case that the control signal Ctrl4 is the input voltage Vin2, the transistor m11 is turned on, and the transistor m12 is turned off. Consequently, the supply voltage Vnn is selected by the selecting device 324. The supply voltage Vnn is transmitted to the node b3. For example, the input voltage Vin2 is 6V, and the input voltage Vin1 is 0V.

Figures 5A, 5B:
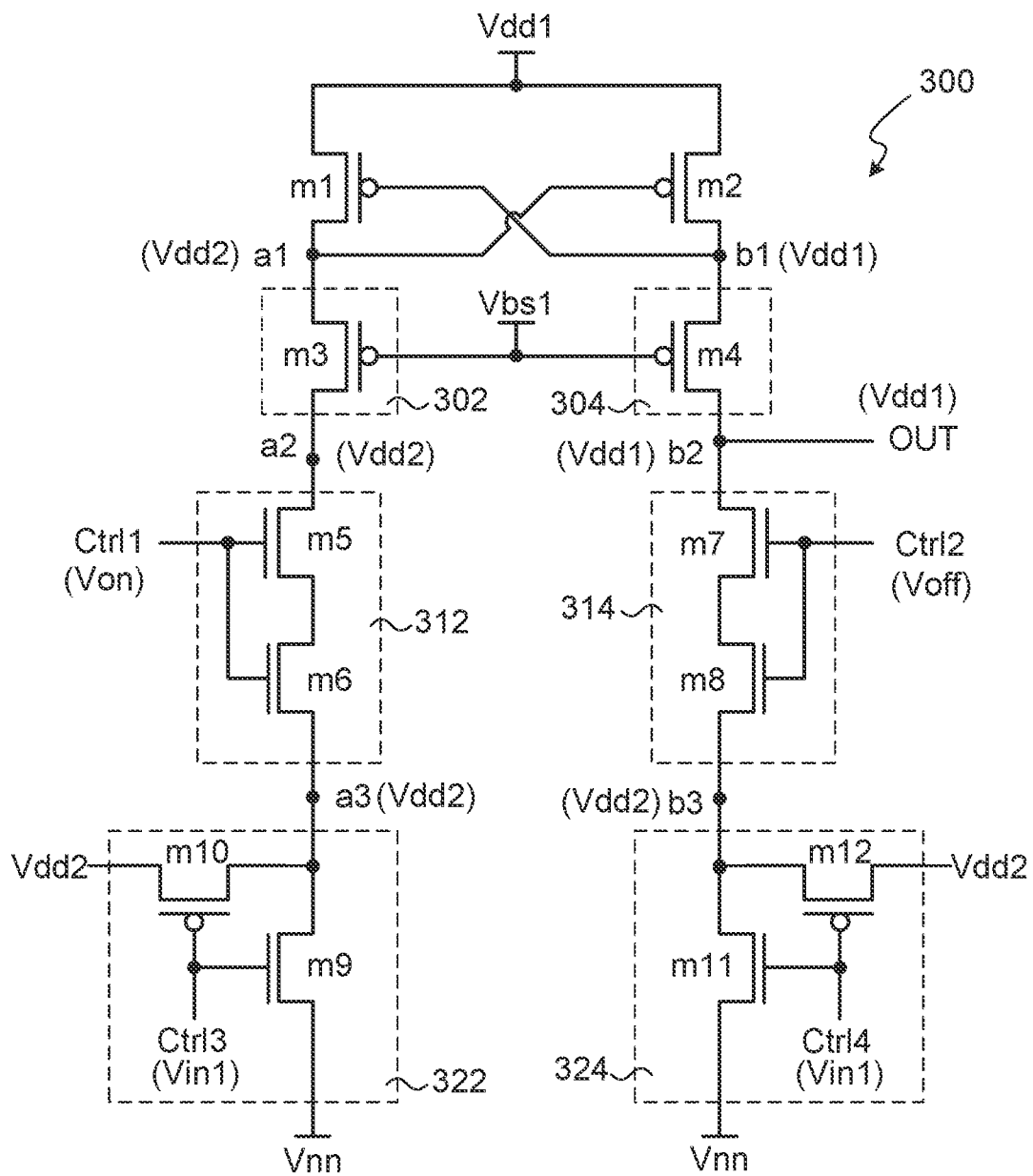
FIG. 5A is an operation table of the driving circuit according to the second embodiment of the present invention.
FIGS. 5B, 5C and 5D are schematic circuit diagrams illustrating the driving circuit of the second embodiment in different operation modes.
Figure 5C:
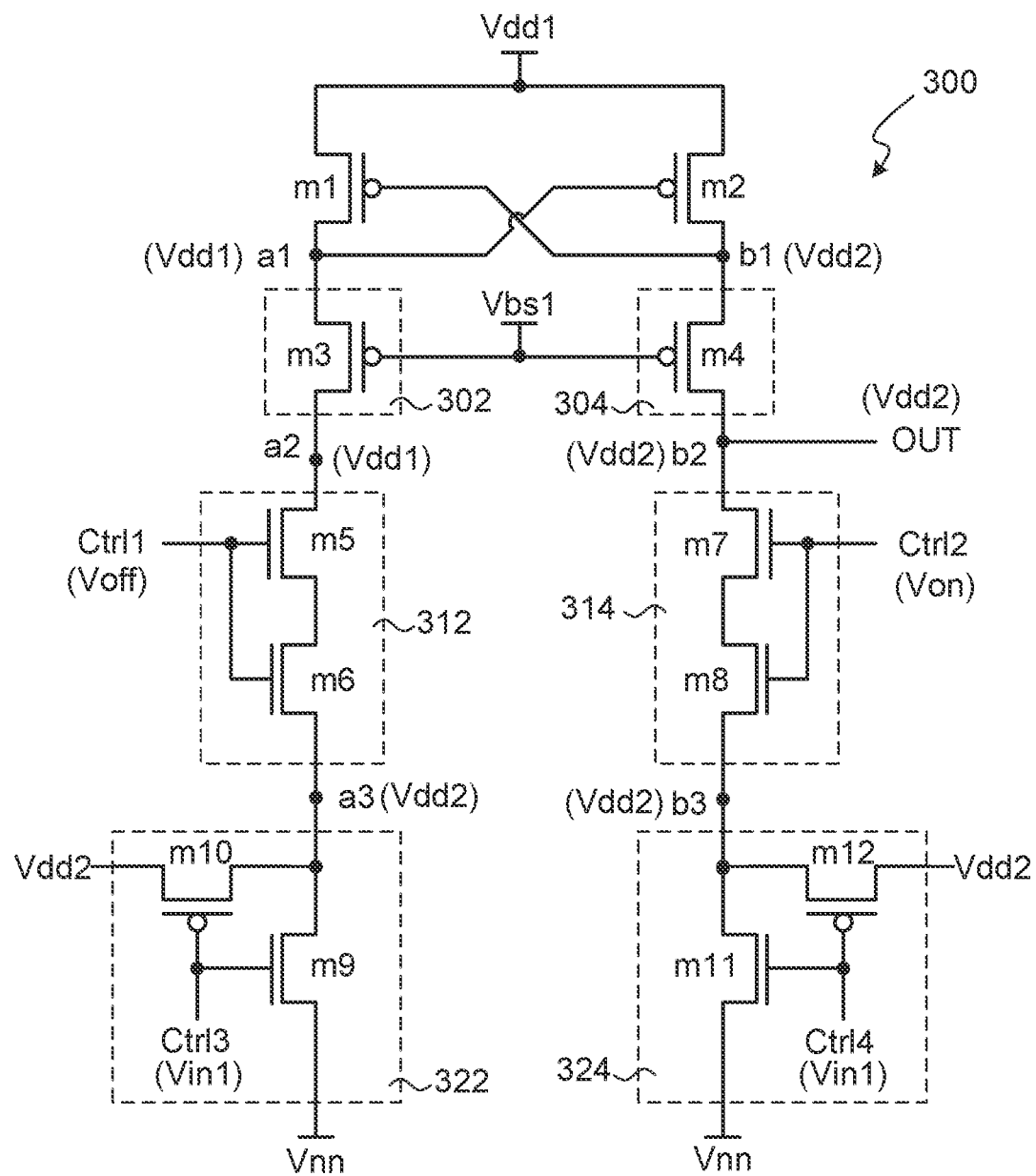
Figure 5D:
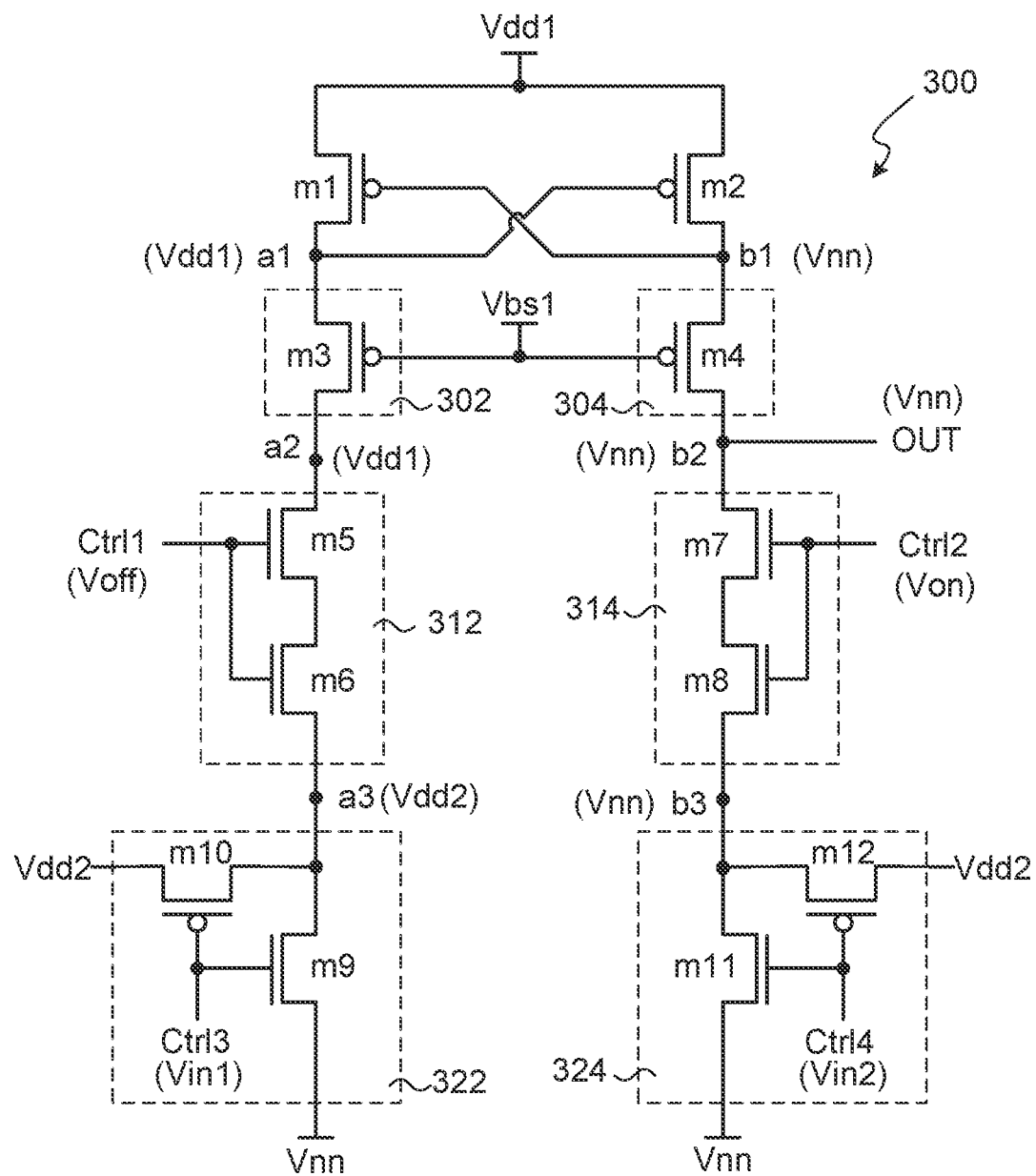

FIG. 5A is an operation table of the driving circuit according to the second embodiment of the present invention. FIGS. 5B, 5C and 5D are schematic circuit diagrams illustrating the driving circuit of the second embodiment in different operation modes.

Please refer to FIGS. 5A and 5B. In the operation mode Mode1, the control signal Ctrl1 is the on voltage Von, the control signal Ctrl2 is the off voltage Voff, the control signal Ctrl3 is the input voltage Vin1, and the control signal Ctrl4 is the input voltage Vin1. Consequently, the switching device 312 is controlled to the close state, and the switching device 314 is controlled to the open state. Under this circumstance, the supply voltage Vdd2 is transmitted to the node a3 through the selecting device 322, and the supply voltage Vdd2 is transmitted to the node b3 through the selecting device 324.

Since the switching device 312 is in the close state and the switching device 314 is in the open state, the supply voltage Vdd2 is transmitted from the node a3 to the node a2 through the switching device 312. Moreover, the supply voltage Vdd2 is transmitted from the node a2 to the node a1 through the conducting device 302. Consequently, the transistor m2 is turned on. Since the voltage at the node b1 is equal to the supply voltage Vdd1, and the transistor m1 is turned off. In addition, the supply voltage Vdd1 is transmitted to the node b2 through the conducting device 304 and served as the driving signal OUT. That is, in the operation mode Mode1, the driving signal OUT is the supply voltage Vdd1.

Please refer to FIGS. 5A and 5C. In the operation mode Mode2, the control signal Ctrl1 is the off voltage Voff, the control signal Ctrl2 is the on voltage Von, the control signal Ctrl3 is the input voltage Vin1, and the control signal Ctrl4 is the input voltage Vin1. Consequently, the switching device 312 is controlled to the open state, and the switching device 314 is controlled to the close state. Under this circumstance, the supply voltage Vdd2 is transmitted to the node a3 through the selecting device 322, and the supply voltage Vdd2 is transmitted to the node b3 through the selecting device 324.

Since the switching device 312 is in the open state and the switching device 314 is in the close state, the supply voltage Vdd2 is transmitted from the node b3 to the node b2 through the switching device 312 and served as the driving signal OUT. Moreover, the supply voltage Vdd2 is transmitted from the node b2 to the node b1 through the conducting device 304. Consequently, the transistor m1 is turned on. Under this circumstance, the voltage at the node a1 is the supply voltage Vdd1, and the transistor m2 is turned off. That is, in the operation mode Mode2, the driving signal OUT is the supply voltage Vdd2.

Please refer to FIGS. 5A and 5D. In the operation mode Mode3, the control signal Ctrl1 is the off voltage Voff, the control signal Ctrl2 is the on voltage Von, the control signal Ctrl3 is the input voltage Vin1, and the control signal Ctrl4 is the input voltage Vin2. Consequently, the switching device 312 is controlled to the open state, and the switching device 314 is controlled to the close state. Under this circumstance, the supply voltage Vdd2 is transmitted to the node a3 through the selecting device 322, and the supply voltage Vnn is transmitted to the node b3 through the selecting device 324.

Since the switching device 312 is in the open state and the switching device 314 is in the close state, the supply voltage Vnn is transmitted from the node b3 to the node b2 through the switching device 314 and served as the driving signal OUT. Moreover, the supply voltage Vnn is transmitted from the node b2 to the node b1 through the conducting device 304. Consequently, the transistor m1 is turned on. Under this circumstance, the voltage at the node a1 is the supply voltage Vdd1, and the transistor m2 is turned off. That is, in the operation mode Mode3, the driving signal OUT is the supply voltage Vnn.

From mentioned above, the present invention provides a driving circuit for the non-volatile memory. The driving circuit receives the supply voltages Vdd1, Vdd2 and Vnn. In various operation modes, the driving circuit selects one of the three supply voltages Vdd1, Vdd2 and Vnn as the driving signal according to the control signals Ctrl1-Ctrl4. In addition, the driving signal is transmitted to the non-volatile memory cell array.

It is noted that numerous modifications and alterations may be made while retaining the teachings of the invention.

Figure 6:
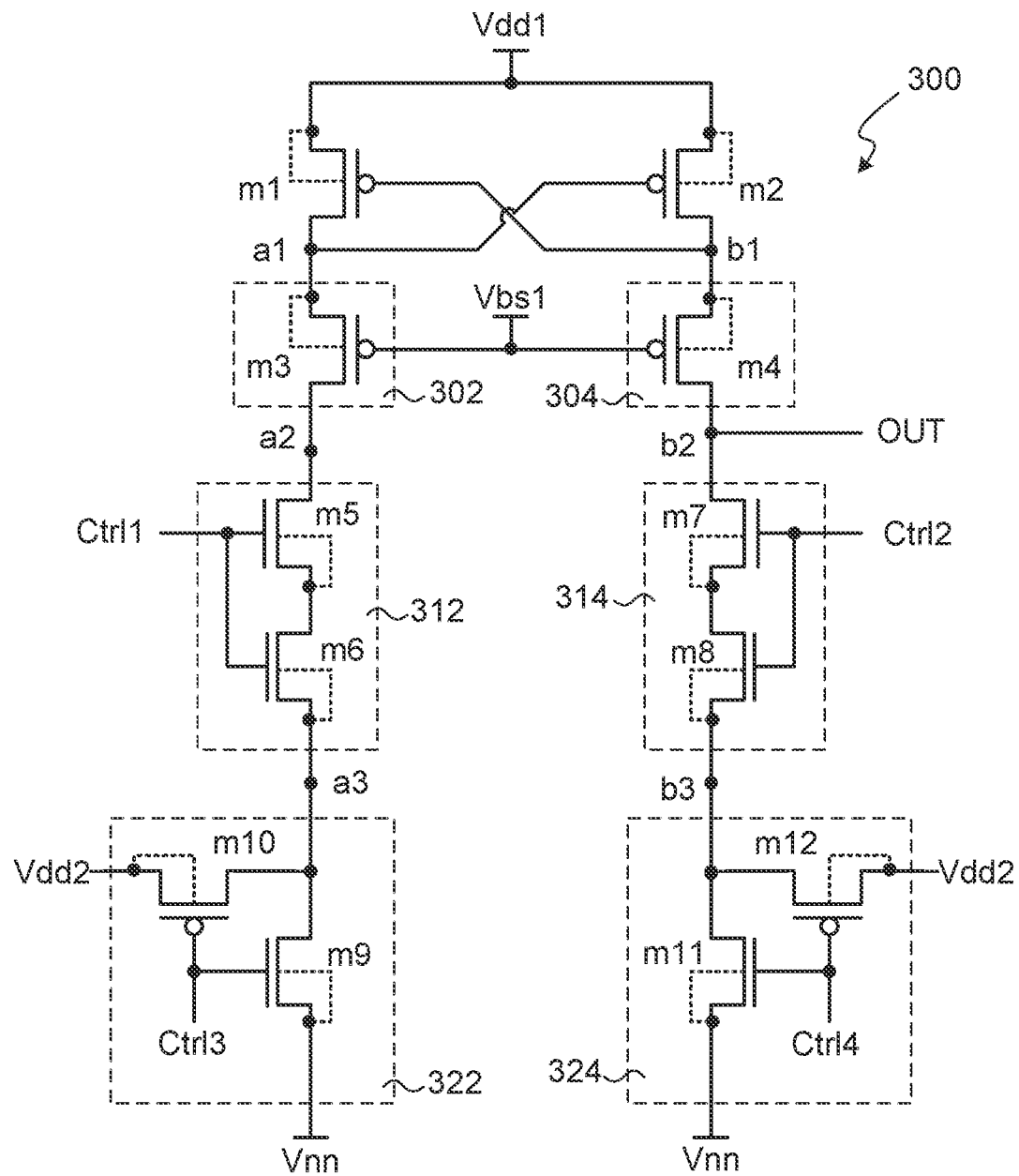
FIG. 6 is a schematic circuit diagram illustrating the connecting relationships between the body terminals of associated transistors in the driving circuit of the second embodiment.

For example, the body terminals of all transistors m1-m12 in the driving circuit 300 of the second embodiment are connected to the proper positions. FIG. 6 is a schematic circuit diagram illustrating the connecting relationships between the body terminals of associated transistors in the driving circuit of the second embodiment. The body terminal of the transistor m1 is connected with the first drain/source terminal of the transistor m1. The body terminal of the transistor m2 is connected with the first drain/source terminal of the transistor m2. The body terminal of the transistor m3 is connected with the first drain/source terminal of the transistor m3. The body terminal of the transistor m4 is connected with the first drain/source terminal of the transistor m4. The body terminal of the transistor m5 is connected with the second drain/source terminal of the transistor m5. The body terminal of the transistor m6 is connected with the second drain/source terminal of the transistor m6. The body terminal of the transistor m7 is connected with the second drain/source terminal of the transistor m7. The body terminal of the transistor m8 is connected with the second drain/source terminal of the transistor m8. The body terminal of the transistor m9 is connected with the second drain/source terminal of the transistor m9. The body terminal of the transistor m10 is connected with the second drain/source terminal of the transistor m10. The body terminal of the transistor m11 is connected with the second drain/source terminal of the transistor m11. The body terminal of the transistor m12 is connected with the second drain/source terminal of the transistor m12.

It is noted that the connecting relationships between the body terminals of associated transistors are not restricted. For example, the body terminals of the transistors are connected to the proper positions according to the types of the transistors m1~m12 (i.e., p-type transistors or n-type transistors). For example, the transistors m1~m4 are the p-type transistors, and the body terminals of the transistors m1~m4 receive the supply voltage Vdd2. The transistors m5~m9 and m11 are the n-type transistors, and the body terminals of the transistors m5~m9 and m11 receive the supply voltage Vnn. The transistors m10 and m12 are p-type transistors, and the body terminals of the transistors m10 and m12 receive the supply voltage Vdd2.

Figure 7:
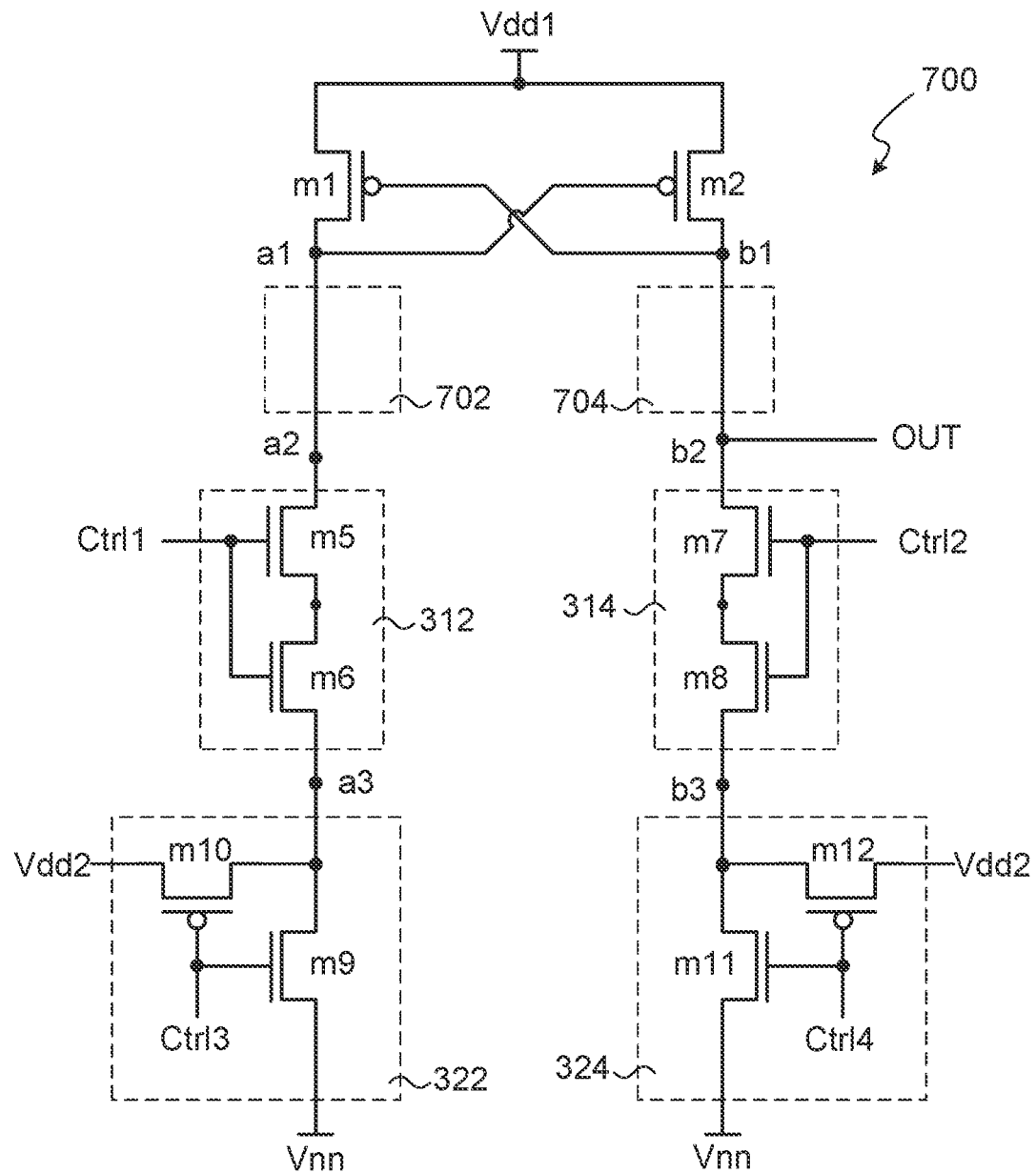
FIG. 7 is a schematic circuit diagram illustrating a driving circuit for the non-volatile memory according to a third embodiment of the present invention.

FIG. 7 is a schematic circuit diagram illustrating a driving circuit for the non-volatile memory according to a third embodiment of the present invention. In the third embodiment, the conducting device 702 and 703 of the driving circuit 700 are replaced by the conducting wires when the voltage differences between the three supply voltages are not large. For example, the supply voltage Vdd1 is 9V, the supply voltage Vdd2 is 3.3V, and the supply voltage Vnn is 0V. That is to say, the node a1 is directly connected to the node a2, and the node b1 is directly connected to the node b2.

In various operation modes of the driving circuit 700, the conducting device 702 and 704 are in the conducting state, and thus the voltage at the node b1 and the node b2 are equal to each other. In other words, the gate terminal of the transistor m1 may be connected with the node b1 or the node b2. Similarly, the gate terminal of the transistor m2 may be connected with the node a1 or the node a2.

In some other embodiments, the supply voltages from a power supply can be adjusted. Consequently, the driving circuit selects one of the plural supply voltages as a driving signal. In addition, the driving signal is transmitted to the non-volatile memory cell array.

Figure 8B:
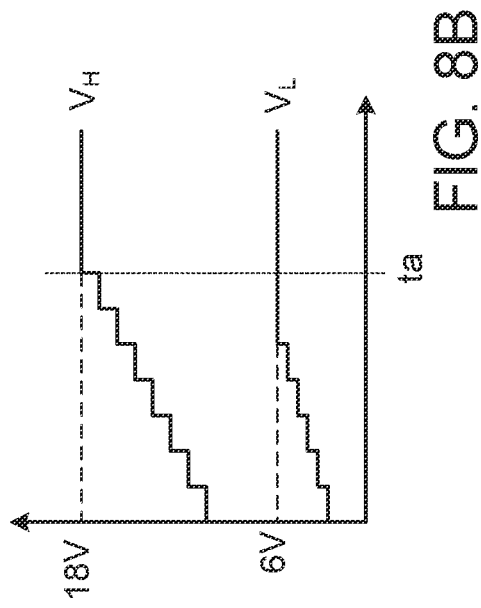
FIG. 8B is a plot illustrating the changes of the associated voltages generated by the voltage generator of the non-volatile memory as shown in FIG. 8A in the first operation mode or the second operation mode.
Figure 8C:
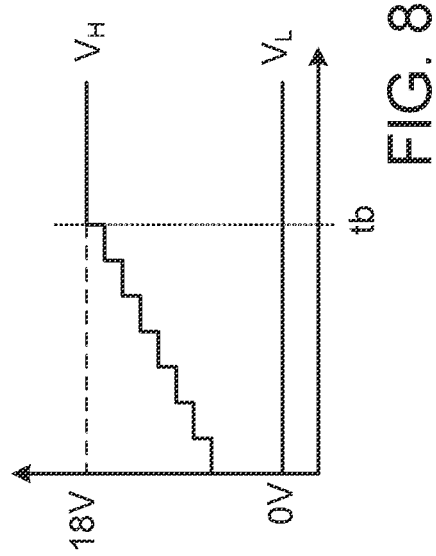
FIG. 8C is a plot illustrating the changes of the associated voltages generated by the voltage generator of the non-volatile memory as shown in FIG. 8A in the first operation mode or the third operation mode.
Figure 8A:
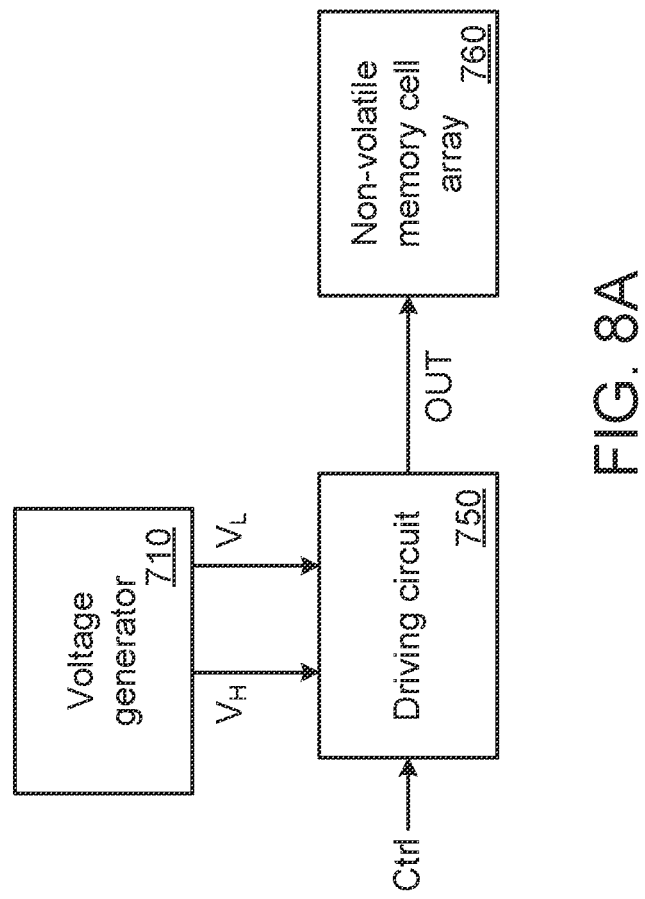
FIG. 8A is a schematic circuit block diagram illustrating the architecture of a non-volatile memory according to another embodiment of the present invention.

FIG. 8A is a schematic circuit block diagram illustrating the architecture of a non-volatile memory according to another embodiment of the present invention. FIG. 8B is a plot illustrating the changes of the associated voltages generated by the voltage generator of the non-volatile memory as shown in FIG. 8A in the first operation mode or the second operation mode. FIG. 8C is a plot illustrating the changes of the associated voltages generated by the voltage generator of the non-volatile memory as shown in FIG. 8A in the first operation mode or the third operation mode.

As shown in FIG. 8A, the non-volatile memory comprises a voltage generator 710, a non-volatile memory cell array 760 and a driving circuit 750. The driving circuit 750 is connected with the voltage generator 710 to receive a supply voltage $V_H$ and a supply voltage $V_L$. For example, the voltage generator 710 comprises at least one charge pump. The charge pump is used to provide the supply voltage $V_H$ and the supply voltage $V_L$.

The driving circuit 750 receives the supply voltages $V_H$ and the supply voltage $V_L$. Moreover, the driving circuit 750 receives the control signal Ctrl to select one of the supply voltages $V_H$ and the supply voltage $V_L$ as a driving signal OUT. The driving signal OUT is transmitted to the non-volatile memory cell array 760. In various operation modes, the voltage generator 710 can change the magnitudes of the supply voltage $V_H$ and the supply voltage $V_L$. Consequently, the driving circuit 750 can generate the driving signal OUT with more than three different voltages.

Please refer to FIG. 8B. When the non-volatile memory is in the first mode Mode1 or the second mode Mode2, the voltage generator 710 changes the magnitudes of the supply voltage $V_H$ and the supply voltage $V_L$. For example, the magnitude of the supply voltage $V_H$ is gradually adjusted to 18V, and the magnitude of the supply voltage $V_L$ is gradually adjusted to 6V. Consequently, after the time point ta, the driving circuit 750 provides the supply voltage $V_H$ (e.g., 18V) or the supply voltage $V_L$ (e.g., 6V) as the driving signal OUT according to the control signal Ctrl. In addition, the driving signal OUT is transmitted to the non-volatile memory cell array 760.

Please refer to FIG. 8C. When the non-volatile memory is in the first mode Mode1 or the third mode Mode3, the voltage generator 710 changes the magnitudes of the supply voltage $V_H$ and the supply voltage $V_L$. The supply voltage $V_H$ is gradually adjusted to 18V, and the supply voltage $V_L$ is 0V. Consequently, after the time point tb, the driving circuit 750 provides the supply voltage $V_H$ (e.g., 18V) or the supply voltage $V_L$ (e.g., 0V) as the driving signal OUT according to the control signal Ctrl. In addition, the driving signal OUT is transmitted to the non-volatile memory cell array 760.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A driving circuit connected with a non-volatile memory cell array, the driving circuit comprising:
   a first conducting device, wherein a first terminal of the first conducting device is connected with a first node, and a second terminal of the first conducting device is connected with a second node;
   a second conducting device, wherein a first terminal of the second conducting device is connected with a third node, and a second terminal of the second conducting device is connected with a fourth node, wherein a voltage at the fourth node is served as a driving signal, and the driving signal is transmitted to the non-volatile memory cell array;
   a first transistor, wherein a first drain/source terminal of the first transistor receives a first supply voltage, a second drain/source terminal of the first transistor is connected with the first node, and a gate terminal of the first transistor is connected with the third node;
   a second transistor, wherein a first drain/source terminal of the second transistor receives the first supply voltage, a second drain/source terminal of the second transistor is connected with the third node, and a gate terminal of the second transistor is connected with the first node;
   a first switching device, wherein a first terminal of the first switching device is connected with the second node, a second terminal of the first switching device is connected with a fifth node, and a control terminal of the first switching device receives a first control signal;
   a second switching device, wherein a first terminal of the second switching device is connected with the fourth node, a second terminal of the second switching device is connected with a sixth node, and a control terminal of the second switching device receives a second control signal;
   a first selecting device, wherein a first terminal of the first selecting device is connected with the fifth node, a second terminal of the first selecting device receives a second supply voltage, a third terminal of the first selecting device receives a third supply voltage, and a control terminal of the first selecting device receives a third control signal; and
   a second selecting device, wherein a first terminal of the second selecting device is connected with the sixth node, a second terminal of the second selecting device receives the second supply voltage, a third terminal of the second selecting device receives the third supply voltage, and a control terminal of the second selecting device receives a fourth control signal,
   wherein the first switching device is in an open state or a close state according to the first control signal,
   wherein the second switching device is in the open state or the close state according to the second control signal,
   wherein one of the second supply voltage and the third supply voltage is transmitted to the fifth node through the first selecting device according to the third control signal,
   wherein one of the second supply voltage and the third supply voltage is transmitted to the sixth node through the second selecting device according to the fourth control signal.

2. The driving circuit as claimed in claim 1, wherein a magnitude of the first supply voltage is higher than a magnitude of the second supply voltage, and the magnitude of the second supply voltage is higher than a magnitude of the third supply voltage.

3. The driving circuit as claimed in claim 2, wherein the first conducting device and the second conducting device are maintained in a conducting state.

4. The driving circuit as claimed in claim 3, wherein in a first operation mode, the first switching device is in the close state, the second switching device is in the open state, the second supply voltage is transmitted to the fifth node through the first selecting device, the second supply voltage is transmitted to the sixth node through the second selecting device, and the second supply voltage is transmitted to the first node through the first switching device and the first conducting device to turn on the second transistor, and the first supply voltage is transmitted to the third node through the second transistor to turn off the first transistor, so that the first supply voltage is transmitted to the fourth node through the second conducting device and served as the driving signal.

5. The driving circuit as claimed in claim 3, wherein in a second operation mode, the first switching device is in the open state, the second switching device is in the close state, the second supply voltage is transmitted to the fifth node through the first selecting device, the second supply voltage is transmitted to the sixth node through the second selecting device, the first transistor is turned on, and the second transistor is turned off, so that the second supply voltage is transmitted to the fourth node through the second switching device and served as the driving signal.

6. The driving circuit as claimed in claim 3, wherein in a third operation mode, the first switching device is in the open state, the second switching device is in the close state, the second supply voltage is transmitted to the fifth node through the first selecting device, the third supply voltage is transmitted to the sixth node through the second selecting device, the first transistor is turned on, and the second transistor is turned off, so that the third supply voltage is transmitted to the fourth node through the second switching device and served as the driving signal.

7. The driving circuit as claimed in claim 3, wherein the first conducting device comprises a third transistor, and the second conducting device comprises a fourth transistor, wherein a first drain/source terminal of the third transistor is connected with the first node, a second drain/source terminal of the third transistor is connected with the second node, and a gate terminal of the third transistor receives a bias voltage, wherein a first drain/source terminal of the fourth transistor is connected with the third node, a second drain/source terminal of the fourth transistor is connected with the fourth node, and a gate terminal of the fourth transistor receives the bias voltage, wherein the third transistor and the fourth transistor are turned on.

8. The driving circuit as claimed in claim 7, wherein the first switching device comprises a fifth transistor and a sixth transistor, and the second switching device comprises a seventh transistor and an eighth transistor, wherein a first drain/source terminal of the fifth transistor is connected with the second node, a gate terminal of the fifth transistor receives the first control signal, a first drain/source terminal of the sixth transistor is connected with a second drain/source terminal of the fifth transistor, a second drain/source terminal of the sixth transistor is connected with the fifth node, and a gate terminal of the sixth transistor receives the first control signal, wherein a first drain/source terminal of the seventh transistor is connected with the fourth node, a gate terminal of the seventh transistor receives the second control signal, a first drain/source terminal of the eighth transistor is connected with a second drain/source terminal of the seventh transistor, a second drain/source terminal of the eighth transistor is connected with the sixth node, and a gate terminal of the eighth transistor receives the second control signal.

9. The driving circuit as claimed in claim 8, wherein the first selecting device comprises a ninth transistor and a tenth transistor, and the second selecting device comprises an eleventh transistor and a twelfth transistor, wherein a first drain/source terminal of the ninth transistor is connected with the fifth node, a gate terminal of the ninth transistor receives the third control signal, a second drain/source terminal of the ninth transistor receives the third supply voltage, a first drain/source terminal of the tenth transistor is connected with the fifth node, a gate terminal of the tenth transistor receives the third control signal, and a second drain/source terminal of the tenth transistor receives the second supply voltage, wherein a first drain/source terminal of the eleventh transistor is connected with the sixth node, a gate terminal of the eleventh transistor receives the fourth control signal, a second drain/source terminal of the eleventh transistor receives the third supply voltage, a first drain/source terminal of the twelfth transistor is connected with the sixth node, a gate terminal of the twelfth transistor receives the fourth control signal, and a second/source terminal of the twelfth transistor receives the second supply voltage.

10. The driving circuit as claimed in claim 9, wherein the first transistor, the second transistor, the third transistor, the fourth transistor, the tenth transistor and the twelfth transistor are p-type transistors, and the fifth transistor, the sixth transistor, the seventh transistor, the eighth transistor, the ninth transistor and the eleventh transistor are n-type transistors.

11. The driving circuit as claimed in claim 9, wherein a body terminal of the first transistor is connected with the first drain/source terminal of the first transistor, a body terminal of the second transistor is connected with the first drain/source terminal of the second transistor, a body terminal of the third transistor is connected with the first drain/source terminal of the third transistor, a body terminal of the fourth transistor is connected with the first drain/source terminal of the fourth transistor, a body terminal of the fifth transistor is connected with the second drain/source terminal of the fifth transistor, a body terminal of the sixth transistor is connected with the second drain/source terminal of the sixth transistor, a body terminal of the seventh transistor is connected with the second drain/source terminal of the seventh transistor, a body terminal of the eighth transistor is connected with the second drain/source terminal of the eighth transistor, a body terminal of the ninth transistor is connected with the second drain/source terminal of the ninth transistor, a body terminal of the tenth transistor is connected with the second drain/source terminal of the tenth transistor, a body terminal of the eleventh transistor is connected with the second drain/source terminal of the eleventh transistor, and a body terminal of the twelfth transistor is connected with the second drain/source terminal of the twelfth transistor.

12. The driving circuit as claimed in claim 9, wherein in a first operation mode, the first control signal is an on voltage, the first switching device is in the close state, the second control signal is an off voltage, the second switching device is in the open state, the third control signal is a first input voltage, the second supply voltage is transmitted to the fifth node through the tenth transistor, the fourth control signal is the first input voltage, the second supply voltage is transmitted to the sixth node through the twelfth transistor, and the second supply voltage is transmitted to the first node through the sixth transistor, the fifth transistor and the third transistor to turn on the second transistor, and the first supply voltage is transmitted to the third node through the second transistor to turn off the first transistor, so that the first supply voltage is transmitted to the fourth node through the fourth transistor and served as the driving signal, wherein a magnitude of the on voltage is higher than a magnitude of the off voltage.

13. The driving circuit as claimed in claim 9, wherein in a second operation mode, the first control signal is an off voltage, the first switching device is in the open state, the second control signal is an on voltage, the second switching device is in the close state, the third control signal is a first input voltage, the second supply voltage is transmitted to the fifth node through the tenth transistor, the fourth control signal is the first input voltage, the second supply voltage is transmitted to the sixth node through the twelfth transistor, the first transistor is turned on, and the second transistor is turned off, so that the second supply voltage is transmitted to the fourth node through the eighth transistor and the seventh transistor and served as the driving signal, wherein a magnitude of the on voltage is higher than a magnitude of the off voltage.

14. The driving circuit as claimed in claim 9, wherein in a third operation mode, the first control signal is an off voltage, the first switching device is in the open state, the second control signal is an on voltage, the second switching device is in the close state, the third control signal is a first input voltage, the second supply voltage is transmitted to the fifth node through the tenth transistor, the fourth control signal is a second input voltage, the third supply voltage is transmitted to the sixth node through the eleventh transistor, the first transistor is turned on, and the second transistor is turned off, so that the third supply voltage is transmitted to the fourth node through the eighth transistor and the seventh transistor and served as the driving signal, wherein a magnitude of the on voltage is higher than a magnitude of the off voltage, and a magnitude of the second input voltage is higher than a magnitude of the first input voltage.

* * * * *